(12) United States Patent
Kim et al.

(10) Patent No.: US 10,964,557 B2
(45) Date of Patent: Mar. 30, 2021

(54) SUBSTRATE PROCESSING APPARATUS AND SUBSTRATE PROCESSING METHOD

(71) Applicant: SEMES CO., LTD., Cheonan-si (KR)

(72) Inventors: Do Yeon Kim, Yongin-si (KR); Jin Kyu Kim, Suwon-si (KR); Yoon Jong Ju, Cheonan-si (KR); Min Sung Han, Hwaseong-si (KR); Joon Ho Won, Cheonan-si (KR); Yong Tak Hyun, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 16/051,059

(22) Filed: Jul. 31, 2018

(65) Prior Publication Data

US 2019/0043741 A1 Feb. 7, 2019

(30) Foreign Application Priority Data

Aug. 4, 2017 (KR) .................. 10-2017-0098782

(51) Int. Cl.
*H01L 21/67* (2006.01)
*H01L 21/687* (2006.01)

(52) U.S. Cl.
CPC .... *H01L 21/67051* (2013.01); *H01L 21/6708* (2013.01); *H01L 21/6715* (2013.01); *H01L 21/67023* (2013.01); *H01L 21/67115* (2013.01); *H01L 21/68742* (2013.01); *H01L 21/68764* (2013.01)

(58) Field of Classification Search
None
See application file for complete search history.

(56) References Cited

U.S. PATENT DOCUMENTS

| | | | | | |
|---|---|---|---|---|---|
| 6,165,552 | A | * | 12/2000 | Anai | B01D 19/0005 427/240 |
| 8,801,231 | B2 | * | 8/2014 | Kim | F21V 29/505 362/294 |
| 2001/0001392 | A1 | * | 5/2001 | Hirae | G03F 1/82 134/1.3 |

(Continued)

FOREIGN PATENT DOCUMENTS

| JP | 2000-012500 | | | 1/2000 |
|---|---|---|---|---|
| JP | 2000012500 | A | * | 1/2000 |

(Continued)

*Primary Examiner* — Andrew Smyth

(57) ABSTRACT

The present disclosure relates to a substrate processing apparatus and a substrate processing method. The substrate processing apparatus according to the exemplary embodiment of the present disclosure may include: a processing liquid supply tube; a nozzle unit which is supplied with a processing liquid from the processing liquid supply tube and discharges the processing liquid to the substrate; and a light source unit which is provided to irradiate the processing liquid discharged from the nozzle unit with ultraviolet rays. According to the present disclosure, the processing liquid, which is electrified while passing the processing liquid supply tube, is irradiated with ultraviolet rays, such that electricity is eliminated from the electrified processing liquid, and as a result, it is possible to minimize a problem that the substrate is contaminated by peripheral particles or arcing occurs on the substrate.

16 Claims, 10 Drawing Sheets

(56) References Cited

U.S. PATENT DOCUMENTS

| | | | | |
|---|---|---|---|---|
| 2001/0021486 A1* | 9/2001 | Kitano | ................... | G03F 7/16 430/322 |
| 2002/0035762 A1* | 3/2002 | Okuda | ............. | H01L 21/67051 15/77 |
| 2002/0059947 A1* | 5/2002 | Sato | ................ | B08B 1/04 134/102.1 |
| 2004/0206452 A1* | 10/2004 | Okuda | ................ | B08B 3/02 156/345.11 |
| 2004/0235308 A1* | 11/2004 | Sato | ................ | H01L 21/67051 438/704 |
| 2005/0229946 A1* | 10/2005 | Hirae | ................ | B08B 3/08 134/1 |
| 2008/0176003 A1* | 7/2008 | Tsutsumi | ........... | H01L 21/67051 427/496 |
| 2008/0176004 A1* | 7/2008 | Muramatsu | ......... | H01L 21/0274 427/508 |
| 2010/0028558 A1* | 2/2010 | Ozawa | ................ | G11B 7/266 427/558 |
| 2010/0301012 A1* | 12/2010 | Spitzl | ............. | H01J 37/32192 216/69 |
| 2014/0041685 A1* | 2/2014 | Kaneko | ................ | B08B 3/08 134/4 |
| 2015/0072536 A1* | 3/2015 | Muramatsu | ............. | G03F 7/40 438/781 |
| 2015/0128990 A1* | 5/2015 | Brown | ................ | C11D 11/0047 134/1 |
| 2015/0128991 A1* | 5/2015 | Brown | ............. | H01L 21/31111 134/1 |
| 2015/0255271 A1* | 9/2015 | Muramatsu | .......... | H01L 21/0271 355/27 |
| 2015/0357188 A1* | 12/2015 | Shimura | ........... | H01L 21/31055 438/5 |
| 2016/0088868 A1* | 3/2016 | Dobrinsky | .............. | A23L 3/28 250/492.1 |
| 2016/0233082 A1* | 8/2016 | Yano | ............ | H01L 21/67086 |

FOREIGN PATENT DOCUMENTS

| | | | | |
|---|---|---|---|---|
| JP | 2000355798 A | * | 12/2000 | |
| JP | 2004124262 A | * | 4/2004 | |
| JP | 2007-149972 | | 6/2007 | |
| JP | 2007149972 A | * | 6/2007 | |
| JP | 2016-004927 | | 1/2016 | |
| JP | 2016004927 A | * | 1/2016 | |
| KR | 10-2012-0013880 | | 2/2012 | |
| KR | 20120013880 A | * | 2/2012 | ............ F21V 29/507 |

* cited by examiner

SUBSTRATE PROCESSING APPARATUS AND SUBSTRATE PROCESSING METHOD

CROSS REFERENCE TO RELATED APPLICATION

This application claims priority under 35 U.S.C. § 119 to Korean Patent Application No. 10-2017-0098782, filed on Aug. 4, 2017 in the Korean Intellectual Property Office, the disclosure of which is incorporated by reference herein in its entirety.

TECHNICAL FIELD

The present disclosure relates to a substrate processing apparatus and a substrate processing method which performs liquid processing on a substrate.

BACKGROUND

In a process of manufacturing a semiconductor or a display, an apparatus is used which performs liquid processing on a substrate to be processed, such as a semiconductor wafer or a glass substrate, by supplying a processing liquid onto the substrate. Examples of this apparatus include a cleaning device that removes particles or contaminants attached to a surface of the substrate.

The cleaning device includes a nozzle for supplying the processing liquid onto the substrate, the nozzle is connected to a processing liquid storage tank through a processing liquid supply tube, and the processing liquid storage tank stores the processing liquid. Typically, the processing liquid supply tube is made of an insulating material such as perfluoroalkoxy (PFA).

Meanwhile, the processing liquid is electrified while the processing liquid flows in the processing liquid supply tube. For example, when deionized water flows in the PFA tube, the PFA tube is negatively electrified, and the deionized water is positively electrified.

When the electrified processing liquid is supplied onto the surface of the substrate, electrically charged particles existing at the periphery of the substrate are moved to the surface of the substrate by attractive force, which causes a problem that the substrate is contaminated by the electrically charged particles or arcing occurs due to static electricity.

SUMMARY

The present disclosure has been made in an effort to provide a substrate processing apparatus and a substrate processing method which are capable of eliminating electricity from the electrified processing liquid.

The present disclosure has also been made in an effort to provide a substrate processing apparatus and a substrate processing method which are capable of minimizing a problem that a substrate is contaminated by particles existing at the periphery of the substrate or arcing occurs on the substrate due to an electrified processing liquid.

An exemplary embodiment of the present disclosure provides a substrate processing apparatus including: a processing liquid supply tube; a nozzle unit which is supplied with a processing liquid from the processing liquid supply tube and discharges the processing liquid to the substrate; and a light source unit which is provided to irradiate the processing liquid discharged from the nozzle unit with ultraviolet rays.

The light source unit may have an ultraviolet ray emission range in which the ultraviolet rays are emitted to the processing liquid supplied onto an upper surface of the substrate, or the light source unit may have an ultraviolet ray emission range in which the ultraviolet rays are emitted to the processing liquid before the processing liquid discharged from the nozzle unit reaches the substrate. Alternatively, the light source unit may have an ultraviolet ray emission range in which the ultraviolet rays are emitted to both of the processing liquid before the processing liquid discharged from the nozzle unit reaches the substrate and the processing liquid supplied onto the upper surface of substrate.

The light source unit may include a housing, and an ultraviolet lamp which is installed in the housing and emits the ultraviolet rays, a reflective surface for reflecting the ultraviolet rays may be installed in the housing, and a range in which the ultraviolet rays are emitted from the light source unit may be determined by the reflective surface. In this state, the multiple reflective surfaces having different angles may be provided and configured to have emission angles of light that vary depending on directions.

In addition, the substrate processing apparatus may include a drive unit which moves the nozzle unit from a standby position to a process position, in which the light source unit may be configured to be moved by the drive unit or moved by a separate drive unit provided separately from the drive unit.

The light source unit may include: an ultraviolet lamp which emits ultraviolet rays; a light guide unit which is connected to the ultraviolet lamp and transmits the ultraviolet rays; and a light irradiation unit which irradiates the processing liquid with the ultraviolet rays transmitted through the light guide unit. Here, the multiple light guide units may be provided, and the multiple light guide units may be connected to the single ultraviolet lamp.

The substrate processing apparatus may further include: an emission range adjusting unit which adjusts an emission range of the ultraviolet rays emitted from the light source unit, in which the emission range adjusting unit may be a rotating shaft.

The ultraviolet ray may have a wavelength range of ultraviolet ray C.

The processing liquid supply tube may be made of an insulating material, and the processing liquid may be positively electrified while passing through the processing liquid supply tube.

Another exemplary embodiment of the present disclosure provides a substrate processing apparatus which performs a liquid processing process by supplying a processing liquid onto a substrate, the substrate processing apparatus including: a processing liquid storage unit; a nozzle unit which discharges the processing liquid to the substrate; a processing liquid supply tube which delivers the processing liquid from the processing liquid storage unit to the nozzle unit; a processing liquid supply valve which is installed in the processing liquid supply tube and operates to open or close; a light source unit which includes an ultraviolet lamp that emits ultraviolet rays to the processing liquid discharged from the nozzle unit; a switch which turns on or off the ultraviolet lamp; and a control unit which controls an operation of opening and closing the processing liquid supply valve and an operation of turning on and off the ultraviolet lamp, in which the control unit controls the operation of opening and closing the processing liquid supply valve in conjunction with the operation of turning on and off the ultraviolet lamp.

The control unit may operate the switch so that the ultraviolet lamp is turned on when a predetermined delay time has elapsed after opening the processing liquid supply valve.

Still another exemplary embodiment of the present disclosure provides a substrate processing method using the substrate processing apparatus, the substrate processing method including: opening the processing liquid supply valve; and turning on the ultraviolet lamp when a predetermined delay time has elapsed after the opening of the processing liquid supply valve.

The predetermined delay time may be set to the amount of time equal to or larger than the amount of time it takes for the processing liquid discharged from the nozzle unit to be supplied onto an upper surface of the substrate after the processing liquid supply valve is opened.

Alternatively, the predetermined delay time may be set to the amount of time equal to or smaller than the amount of time it takes until the processing liquid begins to be discharged from the nozzle unit after the processing liquid supply valve is opened.

According to the exemplary embodiment of the present disclosure, the processing liquid, which is electrified while passing through the processing liquid supply tube, is irradiated with ultraviolet rays, such that electricity may be eliminated from the electrified processing liquid.

In addition, according to the exemplary embodiment of the present disclosure, it is possible to minimize a problem that because the electrified processing liquid is supplied, the substrate is contaminated by peripheral particles or arcing occurs on the substrate.

DESCRIPTION OF EMBODIMENT

Hereinafter, the present disclosure will be described in detail with reference to the accompanying drawings. The following description includes specific exemplary embodiments, but the present disclosure is not limited or restricted by the described exemplary embodiments. In the description of the present disclosure, the specific descriptions of publicly known related technologies will be omitted when it is determined that the specific descriptions may obscure the subject matter of the present disclosure.

Figure 1:
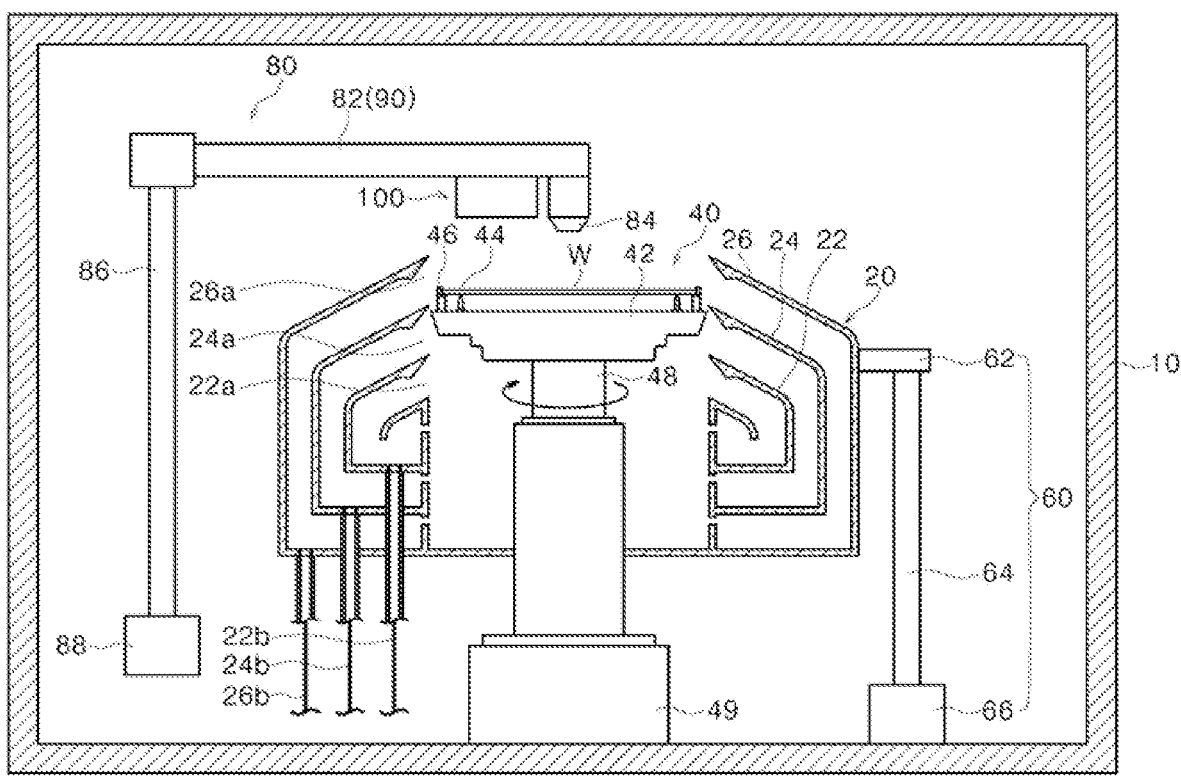
FIG. 1 is a cross-sectional view of a substrate processing apparatus according to an exemplary embodiment of the present disclosure.

FIG. 1 is a cross-sectional view of a substrate processing apparatus according to an exemplary embodiment of the present disclosure. The present disclosure will be described with reference to FIG. 1 illustrating a cleaning device as an example of the substrate processing apparatus according to the present disclosure, but the substrate processing apparatus according to the present disclosure is not limited to the cleaning device.

Referring to FIG. 1, a substrate processing apparatus 1 includes a chamber 10, a cup unit 20, a support unit 40, a lifting unit 60, a processing liquid supply unit 80, and a light source unit 100.

The chamber 10 defines an internal space in which a liquid processing process is performed on a substrate W. The liquid processing process may be performed at a normal pressure or under a vacuum, such that a vacuum pump (not illustrated) for forming a vacuum may be connected to the chamber 10.

The cup unit 20 is positioned in a space in the chamber 10, and the cup unit 20 may include a first cup member 22, a second cup member 24, and a third cup member 26. The cup unit 20 serves to define a substrate processing space and recover a used processing liquid, and each of the cup members 22, 24, and 26 may have an annular shape, in a plan view, that surrounds the substrate W. In this case, the first cup member 22 may be provided at an innermost side, the second cup member 24 may be provided to surround the first cup member 22, and the third cup member 26 may be provided at an outermost side to surround the second cup member 26. First to third openings 22a, 24a, and 26a, which are formed by the cup members 22, 24, and 26, respectively, serve as inlet ports for recovering the processing liquids radially discharged from the rotating substrate W, and the first to third openings 22a, 24a, and 26a may be used to recover the different processing liquids. Recovery tubes 22b, 24b, and 26b, which extend downward, are connected to bottom surfaces of the cup members 22, 24, and 26, respectively. The respective recovery tubes 22b, 24b, and 26b discharge the processing liquid introduced through the respective openings 22a, 24a, and 26a. The discharged processing liquids may be reused after being regenerated by an external processing liquid regenerating device (not illustrated).

The support unit 40 supports the substrate and rotates the substrate while the process is in progress. The support unit 40 includes a spin head 42, support pins 44, chuck pins 46, a driving shaft 48, and a support unit drive unit 49. The spin head 42 has an upper surface having an approximately circular shape when viewed from the top side. The driving shaft 48, which is rotatable by the support unit drive unit 49, is coupled to a bottom surface of the spin head 42. When the driving shaft 48 rotates, the spin head 42 rotates, and thus the substrate W is rotated together with the spin head 42. The spin head 42 includes the support pin 44 and the chuck pin 46 to support the substrate. The multiple support pins 44 protrude from the upper surface of the spin head 42 and serve to support a rear surface of the substrate W. The multiple chuck pins 46 are positioned farther from a center of the spin head 42 than are the support pins 44. The chuck pins 46 are provided to support a lateral surface of the substrate W to prevent the substrate W from deviating from an exact position when the spin head 42 and the substrate W rotate. The chuck pins 46 may be configured to be movable rectilinearly in a radial direction of the spin head 42 between a standby position and a support position. The standby position is a position that is farther from the center of the spin head 42 than is the support position. The chuck pins 46 are positioned at the standby position when the substrate is loaded onto or unloaded from the support unit 40, and the chuck pins 46 are positioned at the support position when the process is performed on the substrate. At the support position, the chuck pins 46 are in contact with a lateral portion of the substrate.

The lifting unit 60 may be configured to move the cup unit 20 upward or downward. The lifting unit 60 may be configured to simultaneously or individually move the respective cup members 22, 24, and 26 of the cup unit 20. A relative height of the cup unit 20 to the support unit 40 is changed as the cup unit 20 is moved upward or downward. The lifting unit 60 has a bracket 62, a lifting shaft 64, and a lifting drive unit 66. The bracket 62 is fixedly installed on an outer wall of the cup unit 20, and the lifting shaft 64, which is moved vertically by the lifting drive unit 66, is fixedly coupled to the bracket 62. The cup unit 20 may be moved downward to prevent the cup unit 20 from interfering with a substrate conveying robot (not illustrated) while the substrate W is placed on the support unit 40 or moved upward from the support unit 40. In addition, when the substrate processing process is in progress, the height of the cup unit 20 may be adjusted such that the processing liquids may be introduced into the predetermined openings 22a, 24a, and 26a, respectively, in accordance with the types of processing liquids supplied onto the substrate W. Alternatively, the spin head 42 may be configured to move vertically instead of the cup unit 20.

The processing liquid supply unit 80 serves to supply the processing liquid onto the substrate W and may include a nozzle arm 82, a nozzle unit 84, a support 86, and a drive unit 88. The support 86 is disposed vertically, and the drive unit 88 is coupled to a lower end of the support 86. The drive unit 88 may rotate and/or move the support 86 upward or downward. The nozzle arm 82 may be coupled to an upper end of the support 86 and may extend horizontally. The nozzle unit 84 is installed on a bottom surface at an end of the nozzle arm 82 and discharges the processing liquid to the substrate. The nozzle unit 84 is moved between a process position and a standby position by the drive unit 88. The process position is a position at which the nozzle unit 84 is disposed vertically above the cup unit 20 to supply the processing liquid onto an upper surface of the substrate W. The standby position is a position at which the nozzle unit 84 deviates from the position vertically above the cup unit 20. As the drive unit 88 rotates the support 86, the nozzle unit 84 and the nozzle arm 82 coupled to the support 86 may be rotated between the process position and the standby position. One or multiple processing liquid supply units 80 may be provided. In a case in which the multiple processing liquid supply units 80 are provided, the respective processing liquid supply units 80 may supply different processing liquids.

The processing liquid may include a cleaning solution such as sulfuric acid or phosphoric acid or a rinsing liquid such as deionized water. The processing liquid flows to the nozzle unit 84 from a processing liquid storage unit (not illustrated) through a processing liquid supply tube 90, and the processing liquid supply tube 90 may be inserted into the nozzle arm 82. The processing liquid supply tube 90 may be made of an insulating material, or the processing liquid supply tube 90 may be a perfluoroalkoxy (PFA) tube.

The light source unit 100 is provided to emit ultraviolet rays UV to a processing liquid F which is discharged from the nozzle unit 84 and supplied onto the substrate W. The ultraviolet ray emitted by the light source unit 100 may be ultraviolet ray C having a wavelength of about 280 nm or less.

A configuration and an effect of the light source unit 100 according to the exemplary embodiment of the present disclosure will be described in detail with reference to FIGS. 2 and 3.

The light source unit 100 includes an ultraviolet lamp 120 that emits ultraviolet rays UV, and the light source unit 100 may have a housing 110 in which the ultraviolet lamp 120 is disposed. Reflective surfaces 110a may be formed in the housing 110 to limit an emission angle of light from the light source unit 100 to a predetermined direction and a predetermined range.

Figure 2:
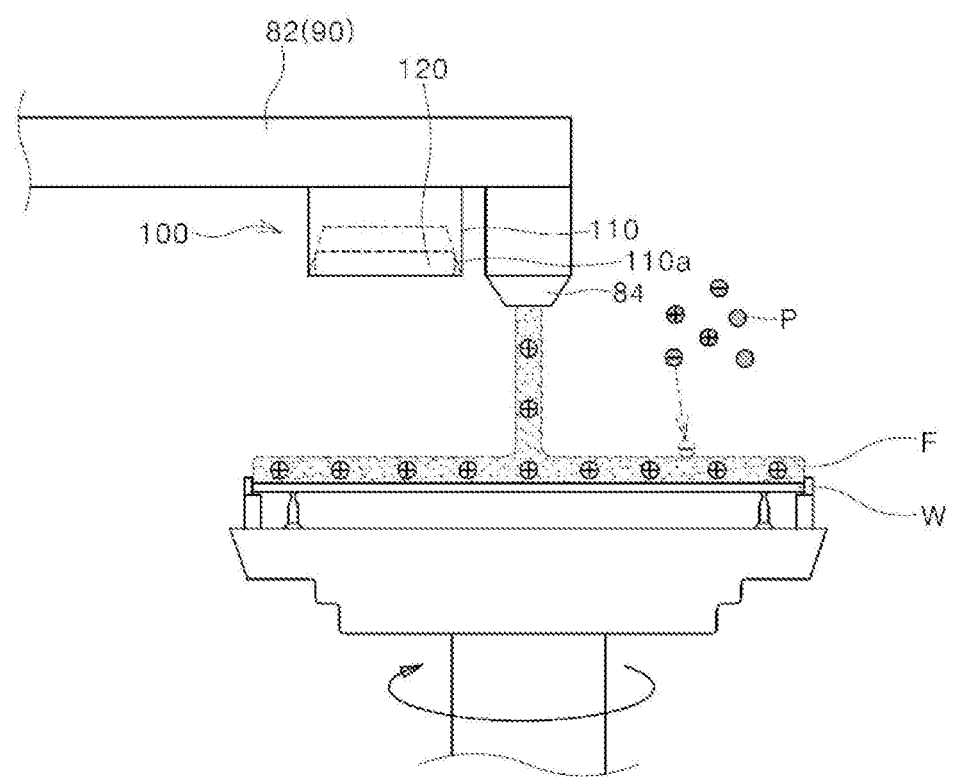
FIGS. 2 to 8 are partial cross-sectional views for explaining light source units of substrate processing apparatuses according to exemplary embodiments of the present disclosure.

FIG. 2 is a view illustrating a state in which the liquid processing process is performed on the substrate W in a state in which the light source unit 100 is not operated and no ultraviolet ray UV is emitted. When the processing liquid F is discharged from the nozzle unit 84 onto the upper surface of the rotating substrate W, a film of the processing liquid F is formed on the upper surface of the substrate as illustrated in the drawing. In this case, the processing liquid F is electrified while passing through the processing liquid supply tube 90, and thus the liquid film in an electrified state is also formed on the upper surface of the substrate. In a case in which the processing liquid supply tube 90 is made of a substance such as a substance that is easily negatively electrified like the PFA tube, the processing liquid F is positively electrified, and thus the processing liquid F attracts particles P negatively electrified among particles at the periphery of the substrate W. The particles may act as a source of contamination to the substrate W. Further, arcing may occur on the substrate W due to the electrified processing liquid F, which may cause damage to the surface of the substrate. In a case in which fine patterns are formed on the surface of the substrate, the particles or the arcing may cause a serious problem in terms of performance or yield.

Figure 3:
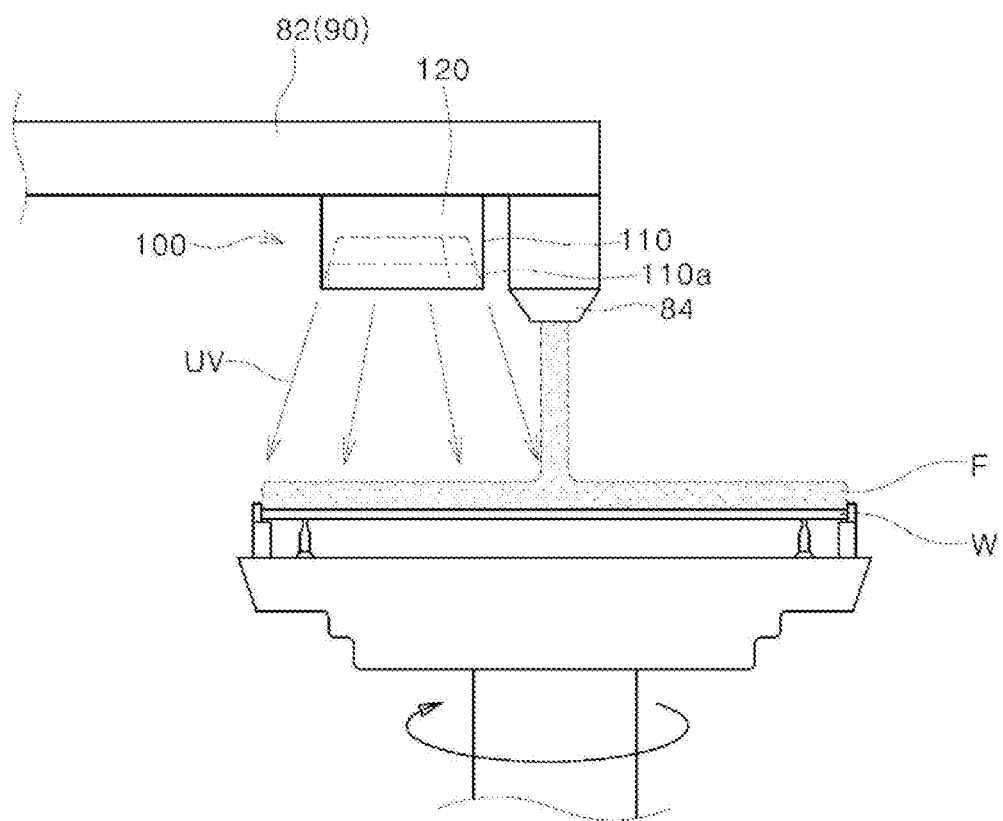

In contrast, when the light source unit 100 operates as illustrated in FIG. 3, the ultraviolet rays UV emitted from the light source unit 100 may eliminate electricity from the processing liquid F. Various principles using ultraviolet rays to eliminate electricity may be applied, and for example, electricity may be eliminated as photoelectrons or other negative (−) ions, which are created by the ultraviolet ray, bind to positive (+) charges on the processing liquid F. The ultraviolet rays with high energy are required to create the photoelectrons and the like, and thus the light source unit 100 may include the ultraviolet lamp 120 that emits the ultraviolet ray C having a wavelength of about 280 nm or less.

Meanwhile, an emission range of the ultraviolet ray may be limited to a range in which the processing liquid is supplied onto the substrate W so that constituent components of the substrate processing apparatus 1 are not damaged by the emitted ultraviolet rays with high energy. To this end, the reflective surfaces 110a may be provided to surround the ultraviolet lamp 120, such that the ultraviolet rays emitted from the ultraviolet lamp 120 travel only in a direction toward the substrate W. In a case in which the light source unit 100 is configured such that the ultraviolet rays UV approximately cover a radial range from a center to an edge of the substrate as illustrated in FIG. 3, the entire processing liquid F supplied onto the upper surface of the substrate W may be irradiated with the ultraviolet rays UV since the substrate W rotates during the liquid processing process.

In the exemplary embodiment illustrated in FIGS. 2 and 3, the light source unit 100 is installed at a predetermined position of the processing liquid supply unit 80, particularly, on the nozzle arm 82, such that the light source unit 100 may be moved between the process position and the standby position without using a separate driving source. That is, when the drive unit 88 rotates the support 86 and the nozzle unit 84 is moved to the process position to perform the liquid processing process, the light source unit 100 coupled to the nozzle arm 82 may also be moved to the process position.

In the case in which the multiple processing liquid supply units 80 are provided, the multiple light source units 100 may also be provided and installed on the multiple processing liquid supply units 80, respectively.

Figure 4:
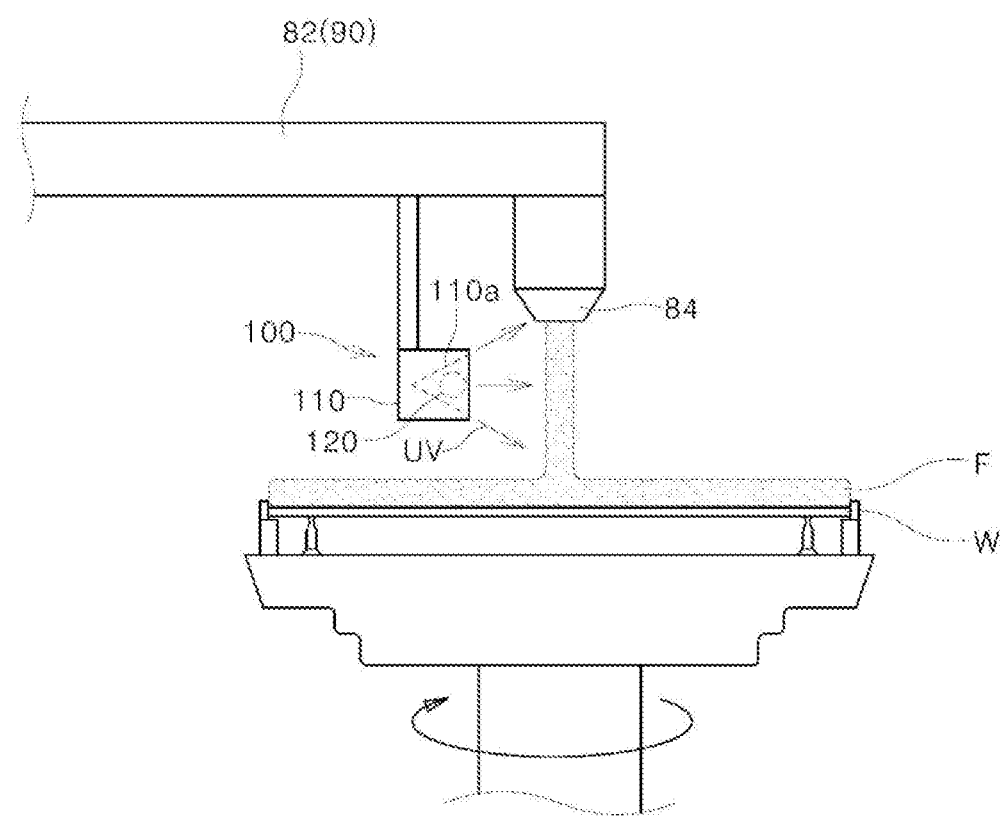

FIG. 4 is a view for explaining a light source unit 100 according to another exemplary embodiment of the present disclosure. Referring to FIG. 4, the light source unit 100 is provided to emit the ultraviolet rays UV to the processing liquid being discharged from the nozzle unit 84. Specifically, the light source unit 100 includes an ultraviolet lamp 120 that emits ultraviolet rays UV, and the light source unit 100 may have a housing 110 in which the ultraviolet lamp 120 is disposed. Reflective surfaces 110a are provided in the housing 110 to adjust an emission angle of light from the light source unit 100 so that the ultraviolet rays UV may be emitted to the processing liquid before the processing liquid discharged from the nozzle unit 84 is supplied onto the substrate W.

In the exemplary embodiment illustrated in FIG. 4, before the processing liquid discharged from the nozzle unit 84 is supplied onto the substrate W, it is possible to eliminate electricity from the processing liquid which is electrified while passing through the processing liquid supply tube 90. For this reason, it is possible to prevent a problem that the substrate W is contaminated by peripheral particles due to the supply of the electrified processing liquid, and it is possible to minimize arcing that may occur at a point in time at which the electrified processing liquid is supplied onto the substrate W. In addition, it is possible to minimize damage to the substrate or fine patterns that may be caused when the substrate W is irradiated with the ultraviolet rays UV with high energy, and it is possible to minimize oxidation of the surface of the substrate caused by ozone ($O_3$) created by the ultraviolet rays UV.

In the case of the exemplary embodiment illustrated in FIG. 4, the light source unit 100 may not be configured such that the ultraviolet rays UV cover approximately a radial range from the center to the edge of the substrate, as long as the processing liquid being discharged from the nozzle unit 84 is irradiated with the ultraviolet rays UV. Therefore, the light source unit 100 may have a relatively small size.

Even in the substrate processing apparatus 1 according to the exemplary embodiment illustrated in FIG. 4, the light source unit 100 is installed at a predetermined position of the processing liquid supply unit 80, particularly, on the nozzle arm 82, such that the light source unit 100 may be moved between the process position and the standby position without using a separate driving source. Further, in the case in which the multiple processing liquid supply units 80 are provided, the multiple light source units 100 may also be provided and installed on the multiple processing liquid supply units 80, respectively.

Figure 5:
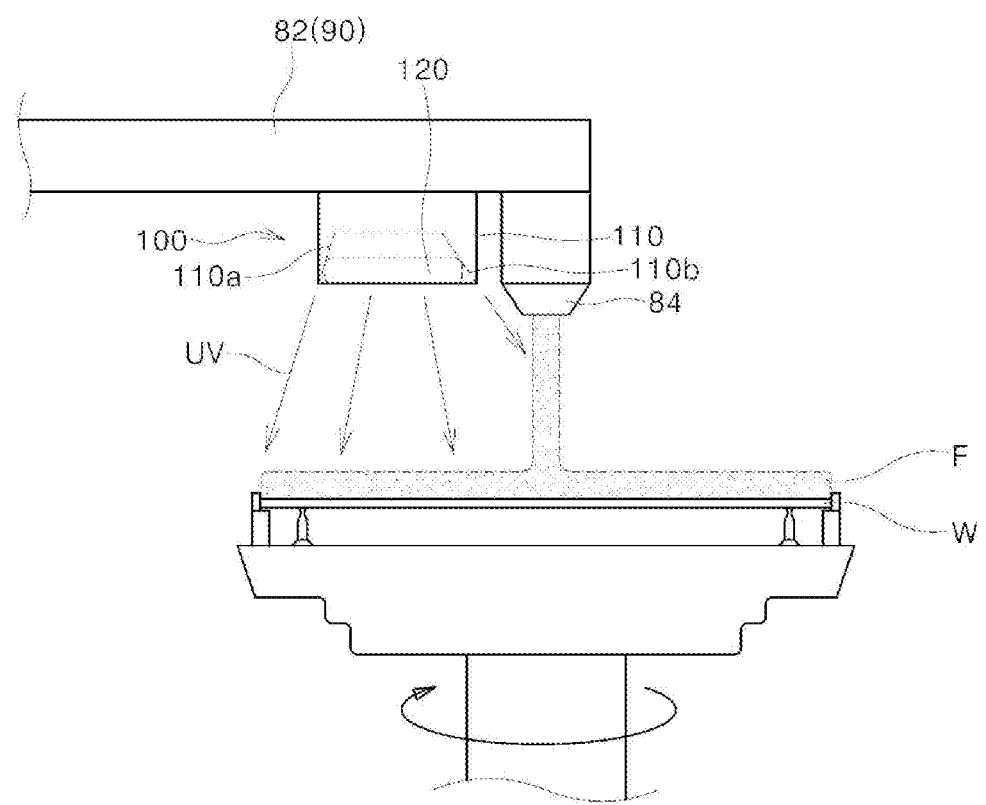

FIG. 5 is a view for explaining a light source unit 100 according to still another exemplary embodiment of the present disclosure. Referring to FIG. 5, a light source unit 100 is configured such that both of the processing liquid F being discharged from the nozzle unit 84 and the processing liquid F supplied onto the substrate W are irradiated with the ultraviolet rays UV. Specifically, the light source unit 100 includes an ultraviolet lamp 120 that emits ultraviolet rays UV, and the light source unit 100 may have a housing 110 in which the ultraviolet lamp 120 is disposed. Multiple reflective surfaces 110a and 110b having different angles may be provided in the housing 110 such that the ultraviolet rays UV emitted from the light source unit 100 may cover approximately a range from a lower end portion of the nozzle unit 84 to the edge of the substrate. That is, the light source unit 100 may be configured to have emission angles of light that vary depending on directions. With this configuration, the ultraviolet rays UV may be emitted toward not only the processing liquid F which is discharged from the nozzle unit 84 but not yet supplied onto the substrate W, but also the entire processing liquid F supplied onto the upper surface of the substrate W in a rotating state.

According to the exemplary embodiment illustrated in FIG. 5, before the processing liquid discharged from the nozzle unit 84 is supplied onto the substrate W, it is possible to eliminate electricity from the processing liquid which is electrified while passing through the processing liquid supply tube 90. For this reason, it is possible to prevent a problem that the substrate W is contaminated by peripheral particles due to the supply of the electrified processing liquid, and it is possible to minimize arcing that may occur at a point in time at which the electrified processing liquid is supplied onto the substrate W. Further, the processing liquid F supplied onto the substrate W is also irradiated with the ultraviolet rays UV, and as a result, it is possible to further improve the effect of eliminating electricity.

Even in the substrate processing apparatus 1 according to the exemplary embodiment illustrated in FIG. 5, the light source unit 100 is installed at a predetermined position of the processing liquid supply unit 80, particularly, on the nozzle arm 82, such that the light source unit 100 may be moved between the process position and the standby position without using a separate driving source. Further, in the case in which the multiple processing liquid supply units 80 are provided, the multiple light source units 100 may also be provided and installed on the multiple processing liquid supply units 80, respectively.

Figure 6:
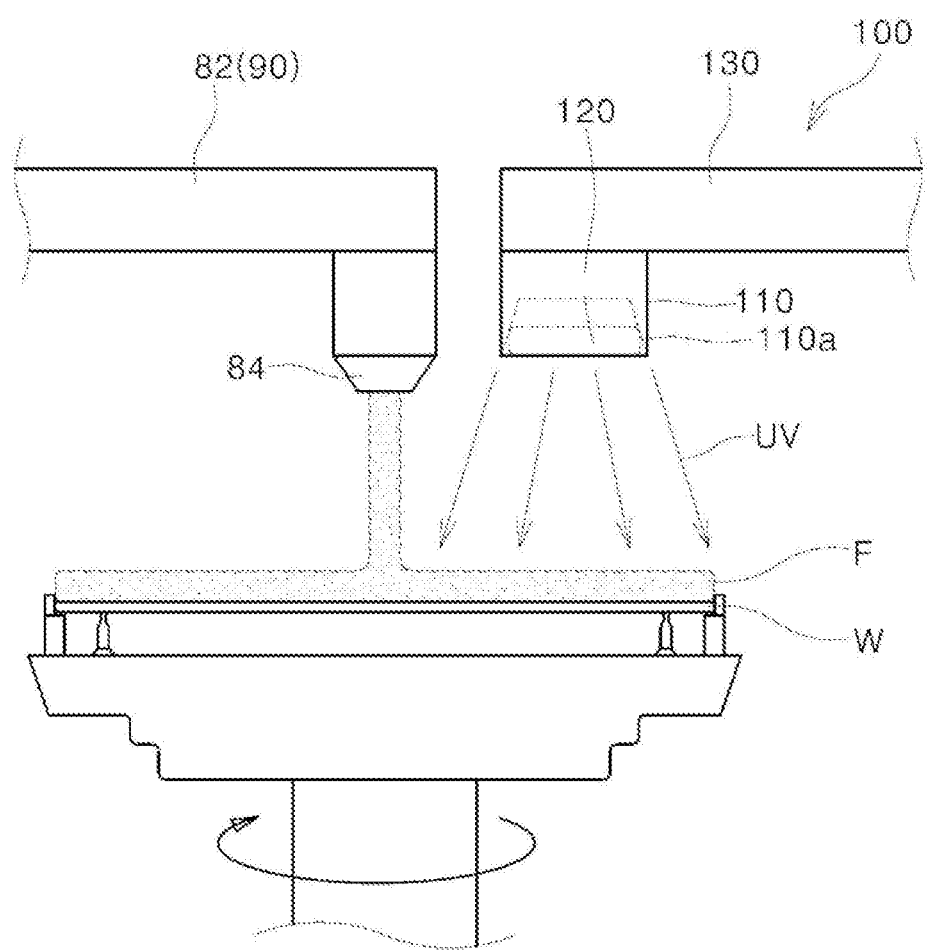

FIG. 6 is a view for explaining a light source unit 100 according to yet another exemplary embodiment of the present disclosure. The exemplary embodiment illustrated in FIG. 6 differs from the exemplary embodiments illustrated in FIGS. 2 to 5 in that a light source unit 100 is not installed on the processing liquid supply unit 80, but the light source unit 100 is provided separately.

Specifically, the light source unit 100 may include an ultraviolet lamp 120 that emits ultraviolet rays UV, a housing 110 in which the ultraviolet lamp 120 is disposed, and a support arm 130 on which the housing 110 is installed. The support arm 130 is configured separately from the nozzle arm 82 of the processing liquid supply unit 80, such that the nozzle arm 82 and the nozzle unit 84 are operated by the drive unit 88 of the processing liquid supply unit 80 independently of the operation of the light source unit 100.

The support arm 130 may be fixedly installed at a predetermined position in the chamber 10, or the support arm 130 may be configured to be operated from a standby position to an ultraviolet ray emission position by a separate support arm drive unit (not illustrated). In the case in which the support arm drive unit (not illustrated) is provided, the light source unit 100 is moved between the ultraviolet ray emission position and the standby position by the support arm drive unit (not illustrated). The ultraviolet ray emission position may be, for example, a position vertically above the cup unit 20 so that the light source unit 100 may emit the ultraviolet rays UV within a predetermined emission range. The standby position may be a position at which the light source unit 100 deviates from the position vertically above the cup unit 20.

According to the exemplary embodiment illustrated in FIG. 6, only one light source unit 100 may be provided even in the case in which the multiple processing liquid supply units 80 are provided. In addition, it may be relatively easy to perform maintenance on the light source unit 100.

FIG. 6 illustrates that reflective surfaces 110a are formed in the housing 110 so that the ultraviolet rays UV emitted from the light source unit 100 cover approximately the range from the center to the edge of the substrate W, but this configuration is illustrative. In the state in which the light source unit 100 is provided separately, as illustrated in FIG. 6, instead of being installed on the processing liquid supply unit 80, the light source unit 100 may be configured such that the ultraviolet rays UV are emitted to the processing liquid before the processing liquid discharged from the nozzle unit 84 is supplied onto the substrate W as illustrated in FIG. 4, or the light source unit 100 may be configured such that the ultraviolet rays UV are emitted to both of the processing liquid F being discharged from the nozzle unit 84 and the processing liquid F supplied onto the substrate W as illustrated in FIG. 5.

Figure 7:
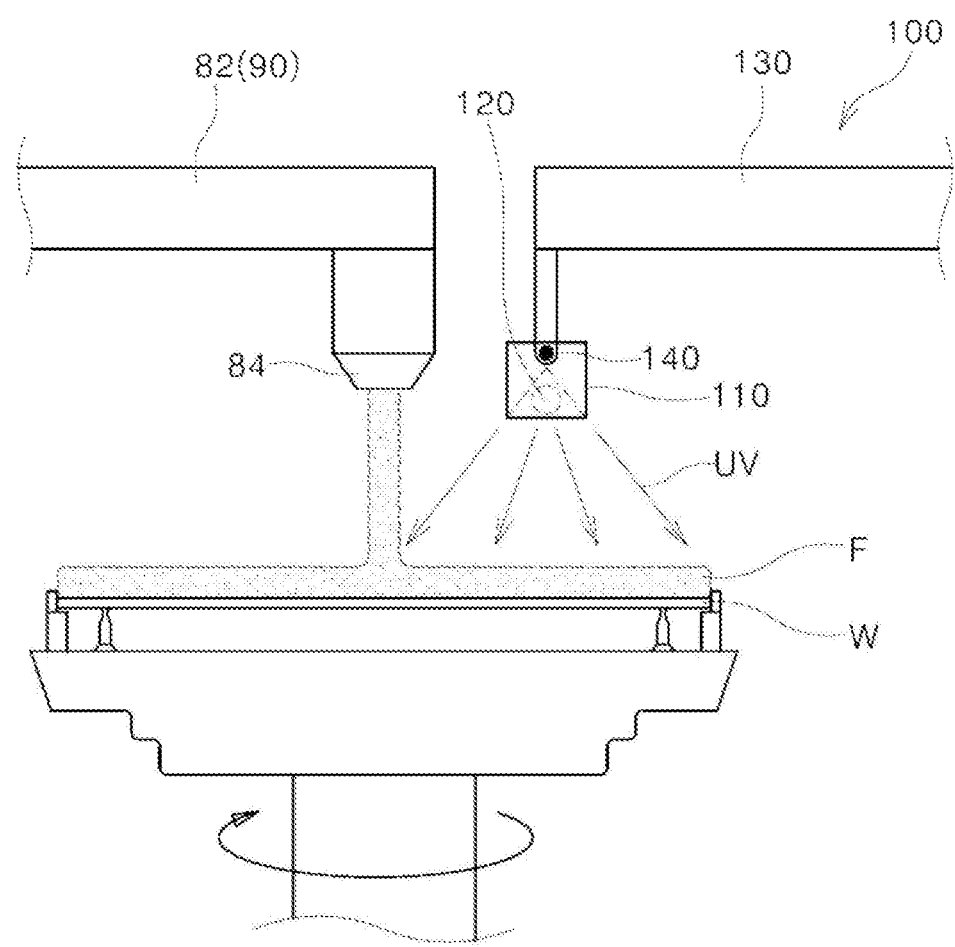

FIG. 7 is a view for explaining a light source unit 100 according to still yet another exemplary embodiment of the present disclosure. The exemplary embodiment illustrated in FIG. 7 differs from the previous exemplary embodiments in that an emission range adjusting unit 140 is provided to adjust an emission range of the ultraviolet rays UV from the light source unit 100.

Referring to FIG. 7 which is an illustrative drawing, the light source unit 100 may include an ultraviolet lamp 120 that emits ultraviolet rays UV, a housing 110 in which the ultraviolet lamp 120 is disposed, and a support arm 130 on which the housing 110 is installed. In this case, the housing 110 is installed to be rotatable about a rotating shaft 140 relative to the support arm 130. Although not illustrated, a fixing member (not illustrated) may be provided to fix the housing 110 to maintain the housing 110 in a state in which the housing 110 is rotated to a predetermined angle.

According to the exemplary embodiment illustrated in FIG. 7, the emission range of the ultraviolet rays UV may be optionally changed and applied in consideration of an electrified state of the processing liquid F, the type of substrate W, a structure of the substrate processing apparatus 1, components in the chamber 10, a wavelength of the ultraviolet ray UV, and the like. For example, as illustrated in FIG. 7, the ultraviolet rays UV may be emitted approximately in the radial range from the center to the edge of the substrate W, and the emission range of the ultraviolet rays UV may be adjusted by rotating the housing 110 by a predetermined angle about the rotating shaft 140 so that the processing liquid F being discharged from the nozzle unit 84 is irradiated with the ultraviolet rays UV.

FIG. 7 illustrates the rotating shaft 140 as an emission range adjusting unit, but this configuration is illustrative. Although not illustrated, the emission range adjusting unit may be a movement means for moving the housing 110 in x, y, and z directions.

The emission range adjusting unit 140 may also be applied to the exemplary embodiments illustrated in FIGS. 2 to 5. That is, the housing 110 may be installed to be rotatable at a predetermined angle relative to the nozzle arm 82 or may be installed to be movable in the x, y, and z directions relative to the nozzle arm 82. With this configuration, it is possible to precisely adjust or change the emission range of the ultraviolet rays UV.

Figure 8:
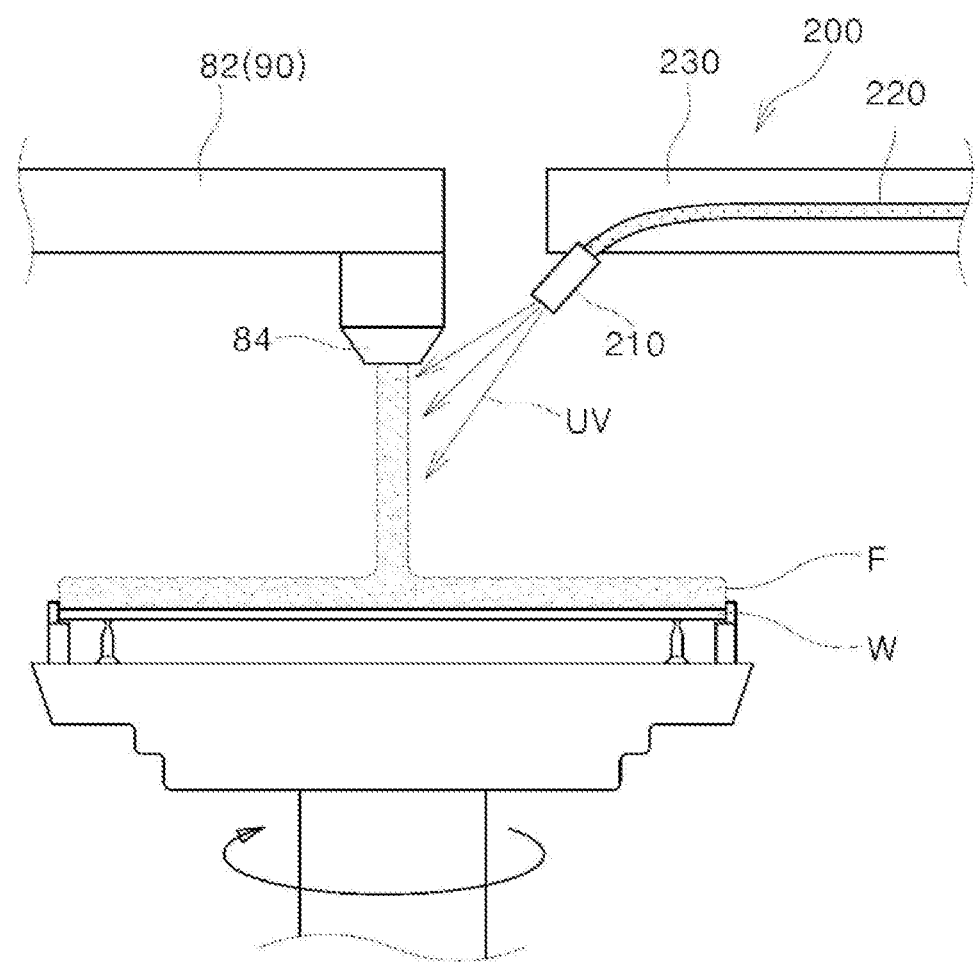

FIG. 8 is a view for explaining a light source 200 according to further another exemplary embodiment of the present disclosure. The exemplary embodiment illustrated in FIG. 8 differs from the previous exemplary embodiments in that ultraviolet rays generated from a remotely disposed ultraviolet lamp (not illustrated) are emitted to the processing liquid F through a light guide unit 220 and a light irradiation unit 210.

Specifically, the light source unit 100 includes the ultraviolet lamp (not illustrated) which generates the ultraviolet rays UV, the light guide unit 220 which connects the ultraviolet lamp and the light irradiation unit 210, and the light irradiation unit 210 which irradiates the processing liquid F with the ultraviolet rays transmitted through the light guide unit 220. The light guide unit 220 and the light irradiation unit 210 may be installed on the support arm 230.

In the exemplary embodiment illustrated in FIG. 8, the ultraviolet lamp (not illustrated) may be remotely disposed, for example, at a position outside the chamber, and as a result, it is easy to replace or repair the ultraviolet lamp. In addition, the light irradiation unit 210 may be designed regardless of a shape or a size of the ultraviolet lamp, and as a result, it is possible to more freely adjust the emission range of the ultraviolet rays UV.

The support arm 230 may be configured separately from the nozzle arm 82 of the processing liquid supply unit 80 as illustrated in FIG. 8, or the support arm 230 may have the same configuration as the nozzle arm 82. That is, the light guide unit 220 and the light irradiation unit 210 may be installed on the nozzle arm 82 without the support arm 230. In the case in which the multiple processing liquid supply units 80 are provided and the light guide units 220 and the light irradiation units 210 are installed on the nozzle arms 82, the light guide unit 220 and the light irradiation unit 210 may be installed on each of the nozzle arms 82. In this case, only a single ultraviolet lamp (not illustrated) may be remotely disposed, and multiple light guide units 220 may be connected to the single ultraviolet lamp.

Hereinafter, a substrate processing method according to another exemplary embodiment of the present disclosure will be described with reference to FIGS. 9 and 10.

Figure 9:
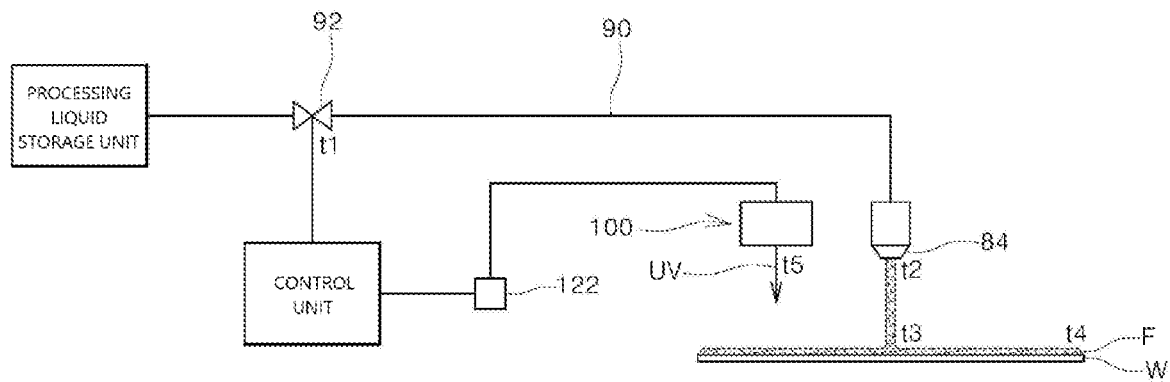
FIG. 9 is a conceptual view for explaining a substrate processing method according to another exemplary embodiment of the present disclosure.

Referring to FIG. 9, the nozzle unit 84 is connected to the processing liquid storage unit through the processing liquid supply tube 90. A processing liquid supply valve 92 is provided in the processing liquid supply tube 90, and the processing liquid supply valve 92 is opened or closed by a control unit. The control unit is also connected to a switch 122 so as to control the switch 122 that turns on or off the ultraviolet lamp of the light source unit 100.

t1 to t5 illustrated in FIG. 9 indicates time. t1 refers to the time when the processing liquid supply valve 92 is opened by a valve opening control signal from the control unit, and t2 refers to the time when the processing liquid F begins to be discharged from the nozzle unit 84 as the processing liquid supply valve 92 is opened. t3 refers to the time when the processing liquid F discharged from the nozzle unit 84 is supplied onto the upper surface of the substrate W, and t4 refers to the time when the supplied processing liquid reaches the edge of the substrate as the substrate rotates. Further, t5 refers to the time when the ultraviolet lamp is turned on under control of the control unit.

Figure 10:
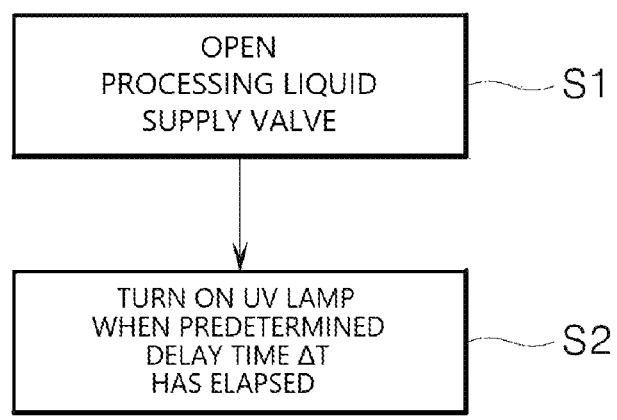
FIG. 10 is a control flowchart for explaining the substrate processing method according to the exemplary embodiment of the present disclosure.

Referring to FIG. 10, the substrate processing method according to the present disclosure includes opening the processing liquid supply valve 92 (S1), and turning on the ultraviolet lamp when a predetermined time Δt has elapsed (S2). Here, the predetermined time Δt may be adjusted depending on exemplary embodiments.

For example, in a case in which the processing liquid F supplied onto the substrate W is intended to be irradiated with the ultraviolet rays UV, like the exemplary embodiment illustrated in FIG. 3, the predetermined time Δt may be set to (t3-t1) or more, particularly, (t4-t1) or more. As described above, the ultraviolet lamp is not turned on immediately after the processing liquid supply valve 92 is opened, but the ultraviolet lamp is turned on when the predetermined time has elapsed after opening the processing liquid supply valve 92, and as a result, it is possible to control the ultraviolet lamp to prevent the substrate W, onto which no processing liquid F is supplied, from being irradiated with the ultraviolet rays UV with high energy.

In addition, like the exemplary embodiment illustrated in FIG. 4, to eliminate electricity before the processing liquid F is supplied onto the upper surface of the substrate W, the predetermined time Δt may be set to (t3-t1) or less, particularly, (t2-t1) or less. Since the predetermined time is set as described above, the processing liquid F, which is electrified while passing through the processing liquid supply tube 90, may be controlled to be exposed to the ultraviolet rays UV before the processing liquid F is supplied onto the upper surface of the substrate W.

The predetermined delay time Δt described above is illustrative and may be variously adjusted depending on exemplary embodiments. That is, the substrate processing method according to the present disclosure is characterized by controlling the operation of opening and closing the processing liquid supply valve 92 in conjunction with the operation of turning on and off the ultraviolet lamp.

Hereinafter, an effect of eliminating electricity from the processing liquid according to the present disclosure will be described based on experimental results.

<Irradiation of Processing Liquid Supplied Onto Surface of Substrate with Ultraviolet Ray>

The effect of eliminating electricity from the processing liquid was tested by using the substrate processing apparatus 1 according to the present disclosure. The light source unit 100 was configured such that the processing liquid F supplied onto the substrate W was irradiated with the ultraviolet rays as illustrated in FIG. 3. Assuming that one cycle is defined when a spraying process of spraying deionized water (DIW) through the nozzle unit 84 while rotating the substrate W and a drying process of rotating the substrate at a high speed without supplying the processing liquid are performed, an electrification degree was measured while repeating the process cycle. The spraying process was performed for 60 seconds at 300 rpm, and the drying process was performed for 25 seconds at 1800 rpm. The electrification degree was measured by a static electricity measuring device, and the measurement of the electrification degree was performed on the surface of the substrate W dried after completing the cycle.

Table 1 shows results of comparing measured values based on whether to emit the ultraviolet rays. When no ultraviolet was emitted, as the process was performed, the electrification degree was greatly increased from 5 V before performing the process, and the electrification degree was increased to 160 V after completing three cycles of the process. In contrast, when the ultraviolet lamp was turned on and the ultraviolet ray was emitted during the spraying process and the drying process, the electrification degree was rather decreased from 10 V before performing the process and the electrification degree of 4 V or less was stably maintained.

TABLE 1

| Point in Time of Measurement of Static Electricity | Ultraviolet Lamp OFF | Ultraviolet Lamp ON |
| --- | --- | --- |
| Before Performing Process | 5 V | 10 V |
| After Completing One Cycle of Process | 110 V | 3 V |
| After Completing Three Cycles of Process | 160 V | 3 V |
| After Completing Five Cycles of Process | 165 V | 3 V |
| After Completing Seven Cycles of Process | 160 V | 4 V |

<Irradiation of Processing Liquid with Ultraviolet Ray Before Supplying Processing Liquid Onto Substrate>

The light source unit 100 was configured such that the processing liquid F was irradiated with the ultraviolet rays before the processing liquid F was supplied onto the substrate W as illustrated in FIG. 4, and then the electrification degree was measured. The static electricity measuring device was directed toward the processing liquid which was discharged from the nozzle unit 84 but not yet supplied onto the substrate W, and the electrified state of the processing liquid was measured before the processing liquid came into contact with the substrate W.

The electrification degree of about 50 to 100 V was measured in the state in which no ultraviolet ray was emitted. In contrast, when the electrification degree was measured after tuning on the ultraviolet lamp, the electrification degree was greatly decreased to about 3 V. Accordingly, it was ascertained that the processing liquid from which electricity was eliminated could be supplied onto the substrate W in the case in which the processing liquid, which was discharged from the nozzle unit 84 via the processing liquid supply tube 90, was irradiated with the ultraviolet rays UV.

While the present disclosure has been described with reference to the limited exemplary embodiments and the drawings, the exemplary embodiments and the drawings are only illustrative, and it may be apparent to those skilled in the art that the exemplary embodiments and the drawings may be variously modified and changed without departing from the technical spirit and scope of the present disclosure. For example, the substrate processing apparatus according to the present disclosure is not limited to the cleaning device, and the substrate processing apparatus may be applied to various devices such as a coating device, an etching device, and an exposure device in which the liquid processing process is performed, and the entirety or parts of the respective exemplary embodiments may be selectively combined and implemented. Accordingly, the protective scope of the present disclosure should be determined by the claims and the equivalents thereto.

What is claimed is:

1. A substrate processing apparatus comprising:
a nozzle arm;
a processing liquid supply tube inserted in the nozzle arm;
a nozzle unit which is connected, in a vertical direction with respect to an upper surface of a substrate, to the nozzle arm and is supplied with a processing liquid from the processing liquid supply tube, and which discharges the processing liquid in the vertical direction to the upper surface of the substrate; and
a light source unit which is provided to emit ultraviolet rays to irradiate on the processing liquid discharged in the vertical direction and only a portion of the substrate, thereby irradiating the processing liquid discharged in the vertical direction from the nozzle unit and the processing liquid disposed on the portion of the substrate, wherein the light source unit includes a housing, and an ultraviolet lamp which is installed in the housing and emits the ultraviolet rays, a reflective surface which is installed in the housing and reflects the ultraviolet rays, and a range in which the ultraviolet rays are emitted from the light source unit is determined by the reflective surface, wherein the ultraviolet lamp and the reflective surface are positioned below the nozzle unit and are configured such that a portion of the ultraviolet rays emitted from the ultraviolet lamp irradiates in a parallel direction relative to the upper surface of the substrate and irradiates the processing liquid while the processing liquid is discharged in the vertical direction to the upper surface of the substrate from the nozzle unit, and wherein the reflective surface is configured to be vertically non-overlapped with the nozzle unit.

2. The substrate processing apparatus of claim 1, wherein the light source unit has an ultraviolet ray emission range in which the ultraviolet rays are emitted to the processing liquid supplied onto an upper surface of the substrate.

3. The substrate processing apparatus of claim 1, wherein the light source unit has an ultraviolet ray emission range in which the ultraviolet rays are emitted to the processing liquid before the processing liquid discharged from the nozzle unit reaches the substrate.

4. The substrate processing apparatus of claim 1, wherein the light source unit has an ultraviolet ray emission range in which the ultraviolet rays are emitted to both of the processing liquid before the processing liquid discharged from the nozzle unit reaches the substrate and the processing liquid supplied onto an upper surface of substrate.

5. The substrate processing apparatus of claim 1, wherein the reflective surface includes multiple reflective surfaces having different angles, and wherein the multiple reflective surfaces are configured to have emission angles of light that vary depending on directions.

6. The substrate processing apparatus of claim 1, further comprising:
a drive unit which moves the nozzle unit from a standby position to a process position,
wherein the light source unit is moved by the drive unit.

7. The substrate processing apparatus of claim 1, further comprising:
a drive unit which moves the nozzle unit from a standby position to a process position,
wherein the light source unit is moved by a drive unit provided separately from the drive unit.

8. The substrate processing apparatus of claim 1, wherein the light source unit further includes:
a light guide unit which is connected to the ultraviolet lamp and transmits the ultraviolet rays; and
a light irradiation unit which irradiates the processing liquid with the ultraviolet rays transmitted through the light guide unit.

9. The substrate processing apparatus of claim 8, wherein the light guide unit includes multiple light guide units, and the multiple light guide units are connected to the ultraviolet lamp.

10. The substrate processing apparatus of claim 1, further comprising:

an emission range adjusting unit which adjusts an emission range of the ultraviolet rays emitted from the light source unit.

11. The substrate processing apparatus of claim 10, wherein the emission range adjusting unit is a rotating shaft.

12. The substrate processing apparatus of claim 1, wherein the ultraviolet rays have a wavelength range of ultraviolet ray C.

13. The substrate processing apparatus of claim 1, wherein the processing liquid supply tube is made of an insulating material, and the processing liquid is positively electrified while passing through the processing liquid supply tube.

14. A substrate processing apparatus which performs a liquid processing process by supplying a processing liquid onto a substrate, the substrate processing apparatus comprising:
a nozzle arm;
a processing liquid storage unit inserted in the nozzle arm;
a nozzle unit which is connected, in a vertical direction with respect to an upper surface of the substrate, to the nozzle arm and discharges the processing liquid in the vertical direction to the upper surface of the substrate;
a processing liquid supply tube which delivers the processing liquid from the processing liquid storage unit to the nozzle unit;
a processing liquid supply valve which is installed in the processing liquid supply tube and operates to open or close;
a light source unit which includes an ultraviolet lamp that emits ultraviolet rays and a reflective surface that reflects the ultraviolet rays emitted from the ultraviolet lamp,
wherein the reflective surface is configured to be vertically non-overlapped with the nozzle unit and to irradiate the ultraviolet rays on only a portion of the substrate, thereby irradiating the processing liquid discharged from the nozzle unit and disposed on the portion of the substrate,
wherein the ultraviolet lamp and reflective surface are positioned below the nozzle unit and are configured such that a portion of the ultraviolet rays emitted from the ultraviolet lamp irradiates in a parallel direction relative to the upper surface of the substrate and irradiates the processing liquid while the processing liquid is discharged in the vertical direction to the upper surface of the substrate from the nozzle unit;
a switch which turns on or off the ultraviolet lamp; and
a control unit which controls an operation of opening and closing the processing liquid supply valve and an operation of turning on and off the ultraviolet lamp,
wherein the control unit controls the operation of opening and closing the processing liquid supply valve in conjunction with the operation of turning on and off the ultraviolet lamp.

15. The substrate processing apparatus of claim 14, wherein the control unit operates the switch so that the ultraviolet lamp is turned on when a predetermined delay time has elapsed after opening the processing liquid supply valve.

16. The substrate processing apparatus of claim 1, further comprising:
a substrate holder configured to hold the substrate;

a rotating shaft configured to rotate the substrate holder so that the entire surface of the substrate is irradiated by the ultraviolet rays emitted by the light source unit.

\* \* \* \* \*